US011022960B2

(12) United States Patent
Tanizawa (10) Patent No.: US 11,022,960 B2
(45) Date of Patent: Jun. 1, 2021

(54) SUBSTRATE PRODUCTION LINE AND SUBSTRATE PRODUCTION MACHINE (71) Applicant: FUJI CORPORATION, Chiryu (JP)

(72) Inventor: Yoshiharu Tanizawa, Toyota (JP)

(73) Assignee: FUJI CORPORATION, Chiryu (JP)

( * ) Notice: Subject to any disclaimer, the term of this patent is extended or adjusted under 35 U.S.C. 154(b) by 26 days.

(21) Appl. No.: 16/469,772

(22) PCT Filed: Dec. 16, 2016

(86) PCT No.: PCT/JP2016/087682
§ 371 (c)(1),
(2) Date: Jun. 14, 2019

(87) PCT Pub. No.: WO2018/109948
PCT Pub. Date: Jun. 21, 2018

(65) Prior Publication Data
US 2020/0096975 A1 Mar. 26, 2020

(51) Int. Cl.
*G05B 19/418* (2006.01)
*H05K 13/08* (2006.01)
*H05K 13/04* (2006.01)

(52) U.S. Cl.
CPC ... *G05B 19/41815* (2013.01); *G05B 19/4183* (2013.01); *H05K 13/0404* (2013.01); *H05K 13/0812* (2018.08); *H05K 13/0882* (2018.08)

(58) Field of Classification Search
CPC .................................................. G05B 19/41815
(Continued)

(56) References Cited

U.S. PATENT DOCUMENTS

| 2011/0197437 A1* | 8/2011 | Nagao | H05K 13/085 29/729 |
| 2016/0096298 A1* | 4/2016 | Uchiyama | B07C 5/342 425/163 |
| 2017/0066133 A1* | 3/2017 | Ooba | B25J 9/1697 |

FOREIGN PATENT DOCUMENTS

| DE | 10 2009 043 642 A1 | 3/2011 |
| EP | 2 237 654 A2 | 10/2010 |

(Continued)

OTHER PUBLICATIONS

International Search Report dated Mar. 14, 2017 in PCT/JP2016/087682 filed Dec. 16, 2016.

*Primary Examiner* — Hien D Khuu
(74) *Attorney, Agent, or Firm* — Oblon, McClelland, Maier & Neustadt, L.L.P.

(57) ABSTRACT

A substrate production line including multiple substrate production machines arranged in a line; a shared folder in which an electronic file from each of the substrate production machines can be created and recognized; a substrate type grasping section on the substrate production machine furthest upstream in the line to grasp the type of the substrate; a file creating section on the substrate production machine other than the substrate production machine furthest downstream in the line to create in the shared folder a substrate type information file including substrate type information indicating the type of the substrate in accordance with unloading of the substrate; and a file recognizing section on the substrate production machine other than the substrate production machine furthest upstream in the line to recognize the substrate type information file created by the substrate production machine directly adjacent at the upstream side before the substrate is loaded.

6 Claims, 5 Drawing Sheets (58) Field of Classification Search
USPC .......................................................... 700/96
See application file for complete search history.

(56) References Cited

FOREIGN PATENT DOCUMENTS

| | | | |
|---|---|---|---|
| JP | 2000-124676 | * | 4/2000 |
| JP | 2000-124676 A | | 4/2000 |
| JP | 2012-28655 A | | 2/2012 |
| JP | 2016-134521 A | | 7/2016 |

* cited by examiner

SUBSTRATE PRODUCTION LINE AND SUBSTRATE PRODUCTION MACHINE

TECHNICAL FIELD

The present application relates to a substrate production line for producing substrates on which electronic components are mounted and a substrate production machine that configures the substrate production line.

BACKGROUND ART

Substrate production machines such as solder printers, component mounters, reflow ovens, and substrate inspection machines are used to produce substrates mounted with many components. Generally, these substrate production machines are connected to form a substrate production line. When changing the type of substrate (substrate type) being produced, it is necessary to perform changeover at the substrate production machine. Conventionally, to perform changeover automatically, a camera for reading the substrate type is provided for each substrate production machine. The substrate type reading camera images a substrate type code provided on the substrate in order to grasp the substrate type. An example of technology related to grasping a substrate type is disclosed in patent literature 1.

A control device of a surface mount system disclosed in patent literature 1 is provided with a means for detecting data of a substrate type at an upstream work machine and a means for transferring the data of the substrate type to a downstream work machine as the substrate is conveyed. Thus, the time required to detect the data of the substrate type is reduced, improving productivity.

CITATION LIST

Patent Literature

Patent literature 1: JP-2000-124676

BRIEF SUMMARY

Technical Problem

However, with conventional technology, because a camera for reading the substrate type is provided for each substrate production machine, costs are high, and space is required for attaching the camera to each substrate production machine. With respect to this, technology of patent literature 1 is effective so far as that a camera for reading the substrate type need only be provided at an upstream work machine (substrate production machine). However, as a means for transferring data of the substrate type to downstream work machines, a communication function is required. Therefore, for a substrate production line without a communication function that enables communication between each of the substrate production machines, the technology from patent literature 1 cannot be used.

The present disclosure takes account of such problems with the background art, and an object thereof is to provide a substrate production line and a substrate production machine that configures the substrate production line in which each substrate production machine can easily grasp a substrate type without having a communication function that enables the substrate production machines to communicate with each other.

Solution to Problem

A substrate production line of the present disclosure includes: multiple substrate production machines arranged in a line from upstream to downstream and configured to each load a substrate from an upstream side, perform production work on the substrate in accordance with a type of the substrate, and unload the substrate to a downstream side; a shared folder in which an electronic file from each of the substrate production machines can be created and recognized; a substrate type grasping section provided on the substrate production machine furthest upstream in the line and configured to grasp the type of the substrate before the substrate is loaded; a file creating section provided on the substrate production machine other than the substrate production machine furthest downstream in the line and configured to create in the shared folder a substrate type information file including substrate type information indicating the type of the substrate in accordance with unloading of the substrate; and a file recognizing section provided on the substrate production machine other than the substrate production machine furthest upstream in the line and configured to recognize the substrate type information file created by the substrate production machine directly adjacent at the upstream side before the substrate is loaded.

Also, a substrate production machine of the present disclosure includes: a work performing section configured to load a substrate from an upstream side, perform production work in accordance with a type of the substrate, and unload the substrate to a downstream side; a shared folder in which a file can be created and recognized, and in which the file can be created and recognized from an upstream side substrate production machine and a downstream side substrate production machine; a file recognizing section configured to recognize a substrate type information file including substrate type information indicating a type of the substrate, the substrate type information file being created in the shared folder by the upstream side substrate production machine in accordance with loading of the substrate; and a file creating section configured to create in the shared folder the substrate type information file to be recognized by the downstream side substrate production machine in accordance with unloading of the substrate, the substrate type information file including the substrate type information.

Advantageous Effects

According to a substrate production line of the present disclosure, a file creating section provided on an upstream side substrate production machine creates substrate type information file in a shared folder and a file recognizing section provided on a downstream substrate production machine recognizes the created substrate type information file. Thus, the substrate type information is sent in order to the downstream substrate production machines in accordance with conveyance of the substrate. Accordingly, each substrate production machine that configures the substrate production line does not require a communication function for communicating with the other machines, and the type of the substrate can be easily grasped using the shared folder.

Also, a substrate production machine of the present disclosure includes a shared folder shared between upstream side substrate production machines and downstream side substrate production machines, and recognizes a substrate type information file created by an upstream substrate production machine in accordance with loading of the substrate, and creates in the shared folder a substrate type information file in accordance with unloading of the substrate. Accordingly, the substrate production machine does not require a communication function and is able to easily grasp the type of the substrate by receiving the substrate type information from an upstream side using the shared folder. Further, the substrate production machine is able to easily send the substrate type information to a downstream side.

DESCRIPTION OF EMBODIMENTS

1. Configuration of Substrate Production Line 1 of a First Embodiment

Figure 1:
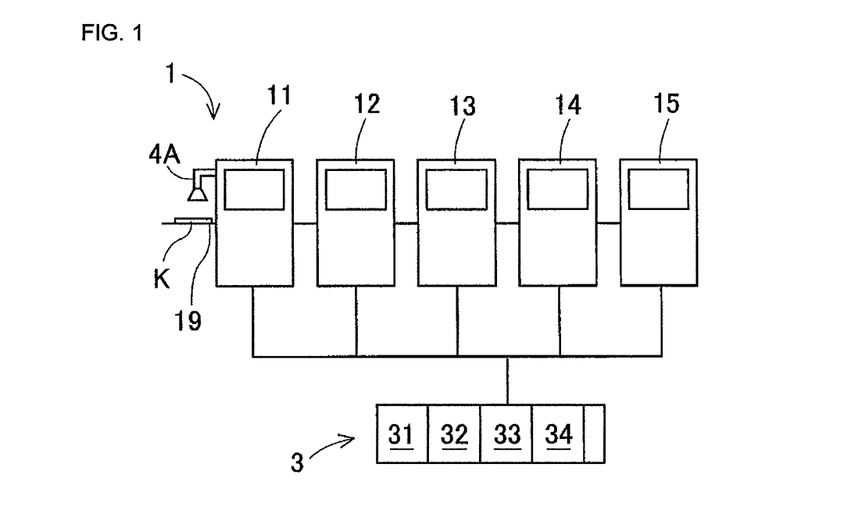
FIG. 1 schematically shows the configuration of a substrate production line of a first embodiment.

Substrate production line 1 of a first embodiment will be described with reference to FIGS. 1 to 8. FIG. 1 schematically shows the configuration of substrate production line 1 of a first embodiment. Substrate production line 1 is configured from five substrate production machines arranged in a line from upstream to downstream. That is, solder printer 11, printing inspection machine 12, first electronic component mounter 13, second electronic component mounter 14, and substrate appearance inspection machine 15 are arranged in a line in that order. Note that, printing inspection machine 12, first electronic component mounter 13, and second electronic component mounter 14 are substrate production machines of the embodiment.

The five substrate production machines each load a substrate K from an upstream side, perform production work on the substrate K in accordance with a type of the substrate K, and unload the substrate K to a downstream side. Specifically, solder printer 11 prints solder paste in a specified pattern onto substrate K. Printing inspection machine 12 inspects the print condition on substrate K. First electronic component mounter 13 and second electronic component mounter 14 mount electronic components onto the solder on the substrate K. Substrate appearance inspection machine 15 inspects the state of electronic components mounted on the substrate K.

The five substrate production machines are not provided with a communication device with which to perform communication between each other. Thus, the five substrate production machines cannot perform data transmission to each other using communication. However, the five substrate production machines include a function for transferring multiple signals between adjacent machines. An example of a signal transfer method is binary signal contact transfer, but the method is not restricted to this. Note that, the configuration of substrate production line 1 shown in FIG. 1 is simply an example, and various other line configurations are possible.

Solder printer 11 that is the furthest upstream machine is provided with substrate type reading camera 4A above loading entrance 19 for loading substrate K. Substrate type reading camera 4A images code information provided on a top surface of board K loaded at loading entrance 19 and the image data is sent to camera control section 41 (refer to FIG. 2). Code information includes substrate type information indicating the type of the substrate K, identification information indicating the individual substrate K, and so on. Examples of the form of the code information include a printed or affixed barcode or character string.

Note that, solder printer 11 may be provided with a second substrate type reading camera below loading entrance 19. The second substrate type reading camera images code information provided on the lower side of substrate K. This allows code information to be imaged reliably even for substrates K for which code information is provided on one side only.

Substrate production line 1 is provided with shared folder 3. Each substrate production machine is able to create electronic files inside shared folder 3. Each substrate production machine can recognize the contents of files inside shared folder 3 and also can delete the files. For example, a general-purpose external memory device may be used as shared folder 3.

Shared folder 3 may be divided into at least four areas with restricted use. First area 31 is an area in which solder printer 11 creates files. Files of first area 31 are recognized and deleted by print inspection machine 12. Similarly, second area 32 is an area in which print inspection machine 12 creates files. Files of second area 32 are recognized and deleted by first electronic component mounter 13. Third area 33 is an area in which first electronic component mounter 13 creates files. Files of third area 32 are recognized and deleted by second electronic component mounter 14. Fourth area 33 is an area in which second electronic component mounter 14 creates files. Files of fourth area 31 are recognized and deleted by substrate appearance inspection machine 15. Dividing shared folder 3 into multiple areas prevents mistakes with files.

2. Function Configuration of Control Section of Substrate Production Machine

Figure 2:
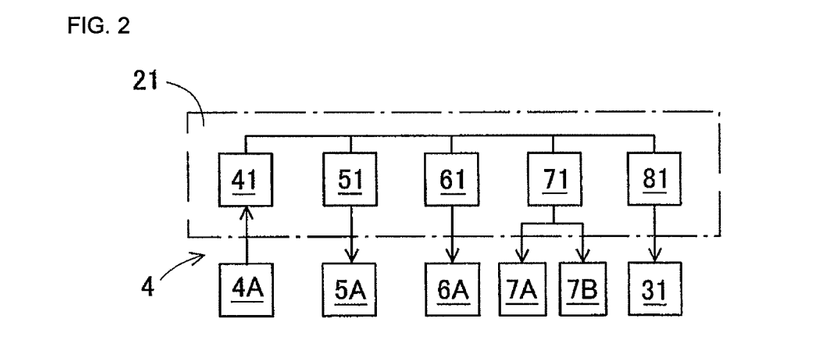
FIG. 2 is a block diagram illustrating the function configuration of a control section of a solder printer that is the furthest upstream machine.

The function configuration of the control section of each substrate production machine is described next. FIG. 2 is a block diagram illustrating the function configuration of control section 21 of solder printer 11 that is the furthest upstream machine. Control section 21 of solder printer 11 includes as control function sections camera control section 41, conveyance control section 51, printing control section 61, changeover control section 71, and file creating section 81. These control function sections link to each other to enable control.

Camera control section 41 controls imaging operation of substrate type reading camera 4A. Also, camera control section 41 performs image processing of the received image data to read the substrate type information and the identification information included in the code information. Camera control section 41 and substrate type reading camera 4A configure substrate type grasping section 4. Substrate grasping section 4 grasps in advance the type of substrate K to be loaded next and identifies the individual substrate K. Further, substrate type grasping section 4 grasps other information included in the code information.

The configuration is not limited to that above and substrate grasping section 4 may be configured with a handy-type barcode scanner or scanner control section provided on solder printer 11. A barcode scanner is operated by an operator to read a barcode (code information) affixed to substrate K. Further, substrate type grasping section 4 may be configured from a receiving device that receives code information of substrate K from a device on the upstream side of substrate production 1 or a host computer that manages operation of substrate production line 1.

Changeover control section 71, in a case in which the type of the substrate K grasped by substrate grasping section 4 is different from the previous type, performs operation as required. That is, changeover control section 71, in a case in which changeover is required in accordance with the switching of the type of substrate K, controls changeover performing section 7A and changeover instruction section 7B.

Changeover performing section 7A automatically performs changeover operation. Examples of changeover operation are operation to adjust the width of the substrate conveyance path in accordance with the change in the width dimension of the substrate K, automatically cleaning the printing squeegee, and so on. Changeover instruction section 7B instructs an operator to perform changeover work that cannot be performed automatically. Examples of such changeover work are exchanging a printing screen in accordance with the change in the type of substrate K, solder resupply work, and so on. Changeover instruction section 7B includes a function for checking the completion of the changeover work.

Substrate grasping section 4 identifies the type of and individual substrate K, and when changeover performing section 7A and changeover instruction section 7B have completed changeover, conveyance control section 51 starts control of substrate conveyance section 5A. Substrate conveyance section 5A performs loading, positioning, and unloading of substrate K. Printing control section 61 controls printing performing section 6A. Printing performing section 6A prints solder onto substrate K based on the type of the substrate K.

File creating section 81, in accordance with substrate K for which printing of solder has been completed being unloaded, creates substrate type information file FL1 (refer to FIG. 5) in first area 31 of shared folder 3. Substrate type information file FL1 is an electronic file including substrate type information indicating the type of the substrate K that was unloaded. File creating section 81 creates substrate type information file FL1 by storing the information included in the code information grasped by substrate type grasping section 4 in a file and giving the file a filename, Nm.

Figure 3:
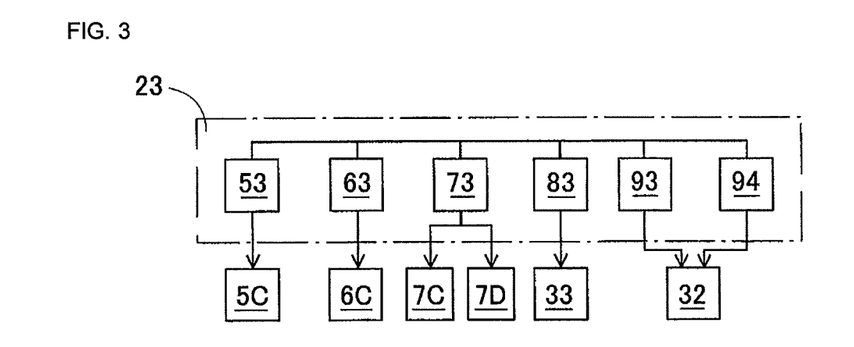
FIG. 3 is a block diagram illustrating the function configuration of a control section of a substrate production machine of the production line except for the machines further upstream and furthest downstream.

FIG. 3 is a block diagram illustrating the function configuration of a control section of a substrate production machine of the production line except for the machines further upstream and furthest downstream. Functions of the control sections of printing inspection machine 12, first electronic component mounter 13, and second electronic component mounter 14 are similar, with descriptions of first electronic component mounter 13 being given as a representative example. As shown in FIG. 3, control section 23 of first electronic component mounter 13, as a control function section, includes conveyance control section 53, mounting control section 63, changeover control section 73, file creating section 83, file recognizing section 93, and file deleting section 94. These control function sections link to each other to enable control.

File recognizing section 93, before substrate K is loaded from printing inspection machine 12 that is immediately upstream, recognizes substrate type information file FL2 (refer to FIG. 5) of second area 32 of shared folder 3. Substrate type information file FL2 is created by printing inspection machine 12 in accordance with unloading of the substrate K for which printing inspection has been completed. Substrate type information file FL2 includes substrate type information, so file recognizing section 93 grasps in advance the type of the substrate K to be loaded next.

Changeover control section 71, in a case in which the type of the substrate K grasped by file recognizing section 93 is different from the previous type, performs operation as required. That is, changeover control section 73, in a case in which changeover is required in accordance with the switching of the type of substrate K, controls changeover performing section 7C and changeover instruction section 7D. Examples of changeover operations performed automatically by changeover performing section 7C are operation to adjust the width of the substrate conveyance path as described above, automatic exchange of suction nozzles used to pickup electronic components, and so on. Examples of changeover operations for which changeover instruction section 7D issues instructions to an operator are changeover of a feeder device or a component supply reel that supplies electronic components, and so on.

After file recognizing section 93 has recognized substrate type information file FL2, file deleting section 94 deletes substrate type information file FL2 from second area 32. When file recognizing section 93 has recognized substrate type information file FL2 and changeover performing section 7C and changeover instruction section 7D have completed changeover, conveyance control section 53 starts performing control of substrate conveyance section 5C. Substrate conveyance section 5C performs loading, positioning, and unloading of substrate K. Mounting control section 63 controls mounting performing section 6C. Mounting performing section 6C mounts electronic components on substrate K based on the type of the substrate K.

File creating section 81, in accordance with substrate K for which mounting of electronic components has been completed being unloaded, creates substrate type information file FL3 (refer to FIG. 5) in third area 33 of shared folder 3. Substrate type information file FL3 is an electronic file including substrate type information indicating the type of the substrate K that was unloaded. File creating section 83 creates substrate type information file FL3 by retaining the contents of substrate type information file FL2 recognized by file recognizing section 93 and changing the filename Nm.

Figure 4:
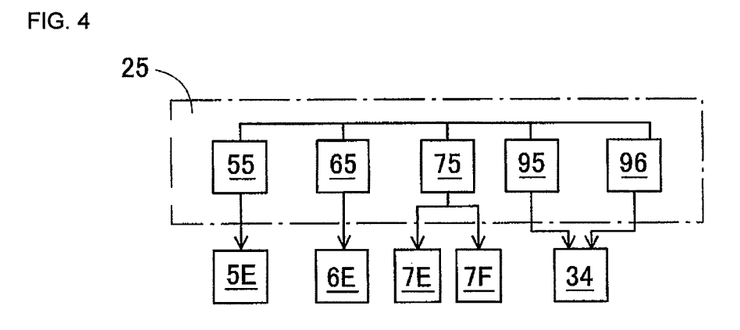
FIG. 4 is a block diagram illustrating the function configuration of a control section of a substrate appearance inspection machine that is the furthest downstream machine.

FIG. 4 is a block diagram illustrating the function configuration of control section 25 of substrate appearance inspection machine 15 that is the furthest downstream machine. Control section 25 of substrate appearance inspection machine 15, as a control function section, includes conveyance control section 55, mounting control section 65, changeover control section 75, file recognizing section 95, and file deleting section 96. These control function sections link to each other to enable control.

File recognizing section 95, before substrate K is loaded from second electronic component mounter 14 that is immediately upstream, recognizes the substrate type information file of fourth area 34 of shared folder 3. This substrate type information file is created by second electronic component mounter 14 in accordance with the unloading of the substrate K for which mounting of electronic component has been completed. The substrate type information file includes substrate type information, so file recognizing section 95 grasps in advance the type of the substrate K to be loaded next.

Changeover control section 75, in a case in which the type of the substrate K grasped by file recognizing section 95 is different from the previous type, performs operation as required. That is, changeover control section 75, in a case in which changeover is required in accordance with the switching of the type of substrate K, controls changeover performing section 7E and changeover instruction section 7F. Examples of changeover operations performed automatically by changeover performing section 7E are operation to adjust the width of the substrate conveyance path as described above, automatic adjustment of imaging conditions of the camera used for inspection by imaging the external appearance of substrate K, and so on. Note that, if there is no changeover work for which to issue an instruction to the operator, changeover instruction section 7F may be omitted.

After file recognizing section 95 has recognized the substrate type information file, file deleting section 96 deletes the substrate type information file from fourth area 34. When file recognizing section 95 has recognized the substrate type information file and changeover performing section 7E and changeover instruction section 7F have completed changeover, conveyance control section 55 starts performing control of substrate conveyance section 5E. Substrate conveyance section 5E performs loading, positioning, and unloading of substrate K. External appearance inspection control section 65 controls external appearance inspection performing section 6E. External appearance inspection performing section 6E inspects the external appearance state of electronic components mounted on substrate K based on the type of the substrate K.

As is clear from descriptions above, substrate type grasping section 4 is only provided on solder printer 11, which is the furthest upstream machine. Also, the file creating sections (81, 83) are provided on the four substrate production machines except for substrate appearance inspection machine 15 that is the furthest downstream machine. The file recognizing sections (93, 95) and file deleting sections (94, 96) are provided on the four substrate production machines except for solder printer 11.

3. File Configuration of Substrate Type Information File

Figure 5:
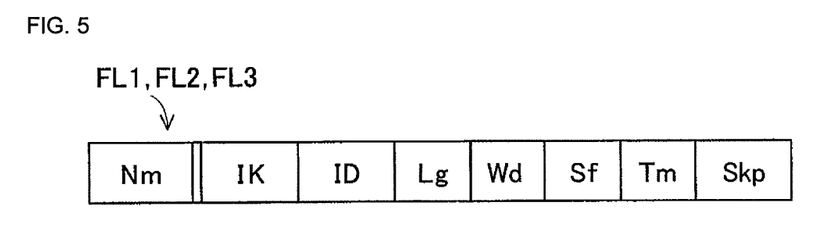
FIG. 5 illustrates the file configuration of a substrate type information file.

Described next is the file configuration of the substrate type information file. The above substrate type information file FL1, substrate type information file FL2, and substrate type information file FL3 include the same contents, so are described all together. FIG. 5 illustrates the file configuration of the substrate type information files (FL1, FL2, FL3). The substrate type information files consist of filename Nm and a contents portion. The contents portion includes substrate type information IK, identification information ID, substrate K length dimension Lg and width dimension Wd, substrate K side Sf, terminate flag Tm, and skip information Skp. The contents portion is newly created at the substrate production machine that is furthest upstream, and is created by being copied by the substrate production machines except for the furthest upstream machine, and then sent in order to the downstream substrate production machines.

Filename Nm is a fixed name different for each substrate production machine that creates the substrate board information file. For example, file creating section 81 of solder printer 11 creates substrate type information file FL1 with filename Nm1, and file creating section 83 of first electronic component mounter 13 creates substrate type information file FL3 with filename Nm3. By making the filenames of the multiple substrate type information files (FL1, FL2, FL3) different from each other, it is possible to prevent errors of the area in which to create files and to prevent errors removing files.

Substrate type information IK indicates the type of the substrate (substrate type) as described above. Identification information ID represents an individual substrate K. The identification information ID is, for example, a serial number or a time when the code information was printed on substrate K. Length dimension Lg and width dimension Wd of substrate K are referenced by the changeover performing sections (7A, 7B, 7C) described above. Side Sf of substrate K is information indicating whether the upper side of substrate K is the top surface or the bottom surface.

Terminate flag Tm is information indicating that the quantity of produced substrates K has reached the planned production quantity for substrate K. Solder printer 11 saves information of the planned production quantity in advance, and increments the produced quantity every time a substrate K is unloaded. Further, when the substrate K for which the produced quantity has reached the planned production quantity is unloaded, file creating section 81 of solder printer 11 sets the terminate flag Tm of substrate type information file FL1 to on.

Figure 6:
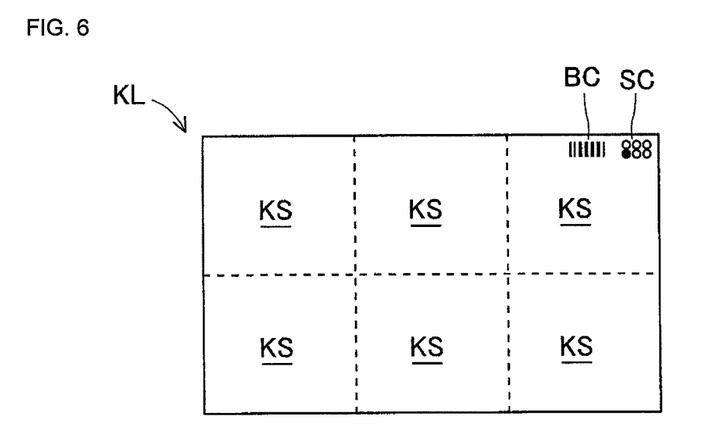
FIG. 6 is a plan view of a multi-board substrate that schematically illustrates skip information.

Skip information Skp is used when substrate K is a multi-board substrate KL. FIG. 6 is a plan view of a multi-board substrate KL that schematically illustrates skip information Skp. Multi-board substrate KL is divided along the dashed lines of the figure after electronic components have been mounted on the substrate. Thus, six individual substrates KS are produced. Affixed in the top right corner of multi-board substrate KL are barcode BC and skip code SC representing code information. Barcode BC and skip code SC are imaged by substrate type reading camera 4A of solder printer 11.

Skip code SC indicates an individual substrate KS that cannot be used and thus prevents wasted production work from being performed. Skip code SC has six circles corresponding to the arrangement of the individual substrates KS. A white circle means that the corresponding individual substrate KS can be used, and a black circle means that the corresponding individual substrate KS cannot be used. In the example shown in FIG. 6, the individual substrate KS in the bottom left cannot be used. The information represented by the six circles of the skip code SC are the skip information Skp.

4. Operation and Use of Substrate Production Line 1 of the First Embodiment

Figure 7:
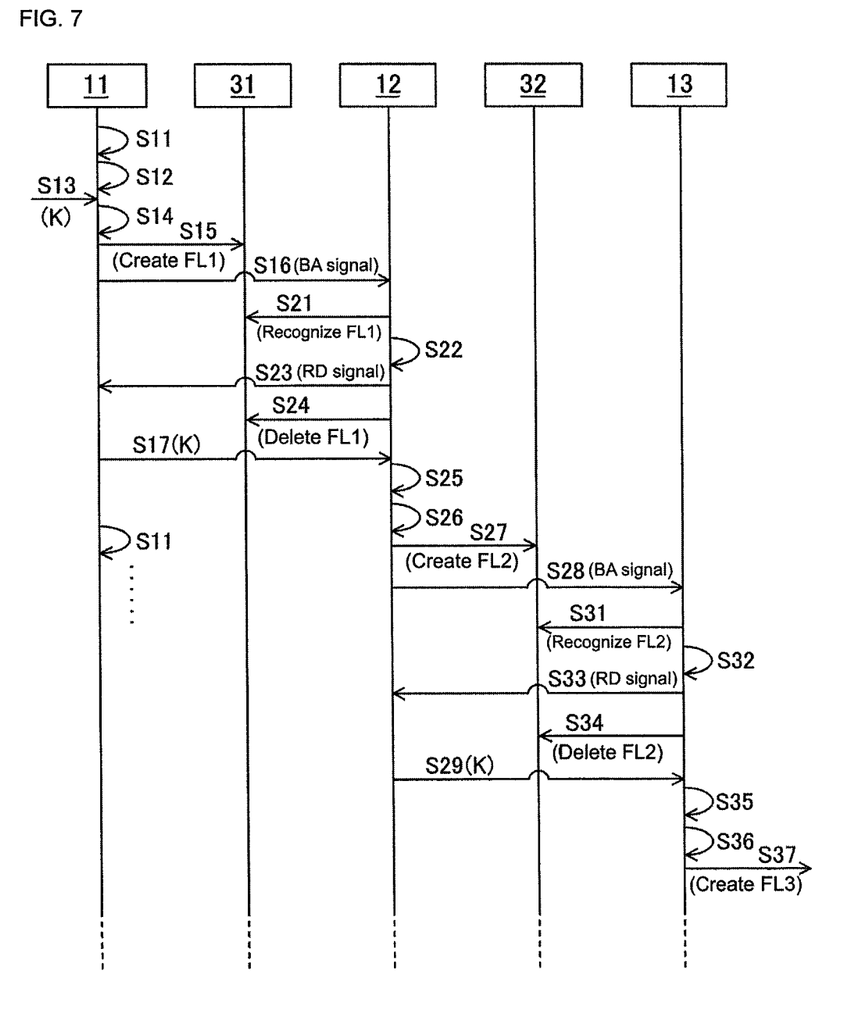
FIG. 7 illustrates a range of operation of the substrate production line of the first embodiment from the solder printer to the first electronic component mounter.

Operation and use of substrate production line 1 of the first embodiment are described next. FIG. 7 illustrates a range of operation of substrate production line 1 of the first embodiment from solder printer 11 to first electronic component mounter 13. Arranged from left to right in FIG. 7 are solder printer 11, first area 31 of shared folder 3, printing inspection machine 12, second area 32 of shared folder 3, and first electronic component 13. Operation is represented in chronological order in FIG. 7 from top to bottom.

In S11 of FIG. 7, substrate type grasping section 4 of solder printer 11 grasps the type of the substrate K (substrate type) at loading entrance 19. In S12, changeover control section 71 of solder printer 11, based on the grasped substrate type, performs control for changeover as required. In S13, conveyance control section 51 of solder printer 11 controls substrate conveyance section 5A to load substrate K. In S14, printing control section 61 of solder printer 11 controls printing performing section 6A based on the grasped substrate type to print solder on the substrate K.

In S15, file creating section 81 of solder printer 11 creates substrate type information file FL1 including substrate type information IK of the grasped substrate type in first area 31. In S16, solder printer 11 sends signal BA to printing inspection machine 12. Signal BA indicates a state in which substrate K can be unloaded and is sent, for example, via an electrical contact point. In the printing inspection machine 12 that receives the signal BA, the file recognizing section starts operating. In S21, the file recognizing section of the printing inspection machine 12 recognizes the substrate type information file FL1 in first area 31 and grasps the substrate type information IK.

In S22, the changeover control section of printing inspection machine 12, based on the substrate type information IK, performs control for changeover as required. In S23, printing inspection machine 12 sends signal RD to solder printer 11. Signal RD indicates a state in which a substrate K can be loaded and is sent, for example, via an electrical contact point. In S24, the file deleting section of printing inspection machine 12 deletes substrate type information file FL1 from first area 31.

In the solder printer 11 that received the signal RD, in S17, conveyance control section 51 controls substrate conveyance section 5A to unloaded substrate K. In printing inspection machine 12, in S25, the conveyance control section controls the substrate conveyance section to load substrate K. In S26, the printing inspection control section of printing inspection machine 12 controls the printing inspection performing section based on substrate type information IK to perform inspection of the solder printing state on substrate K.

In S27, the file creating section of printing inspection machine 12 creates substrate type information file FL2 including substrate type information IK in second area 32. In S28, printing inspection machine 12 sends signal BA to first electronic component mounter 13. In the first electronic component mounter 13 that receives the signal BA, file recognizing section 93 starts operating. In S31, file recognizing section 93 of first electronic component mounter 13 recognizes the substrate type information file FL2 in second area 32 and grasps the substrate type information IK.

In S32, the changeover control section of first electronic component mounter 13, based on the substrate type information IK, performs control for changeover as required. In S33, first electronic component mounter 13 sends signal RD to printing inspection machine 12. In S34, file deleting section 94 of first electronic component mounter 13 deletes substrate type information file FL2 from second area 32.

In printing inspection machines that received the signal RD, in S29, the conveyance control section controls the substrate conveyance section to unload substrate K. In first electronic component mounter 13, in S35, conveyance control section 53 controls substrate conveyance section 5C to load substrate K. In S36, mounting control section 63 of first electronic component mounter 13 controls mounting performing section 6C based on substrate type information IK to mount electronic components on the substrate K. In S37, file creating section 83 of first electronic component mounter 13 creates substrate type information file FL3 including substrate type information IK in third area 33.

Similar operations are performed for first electronic component mounter 13, second electronic component mounter 14, and substrate appearance inspection machine 15 of substrate production line 1. Thus, creating, recognizing, and deleting of the substrate type information file are performed in accordance with conveyance of substrate K. Also, in solder printer 11, whenever a substrate K is loaded to loading entrance 19, steps from S11 are repeated. Further, operations are additionally repeated from the downstream printing inspection machine 12.

Figure 8:
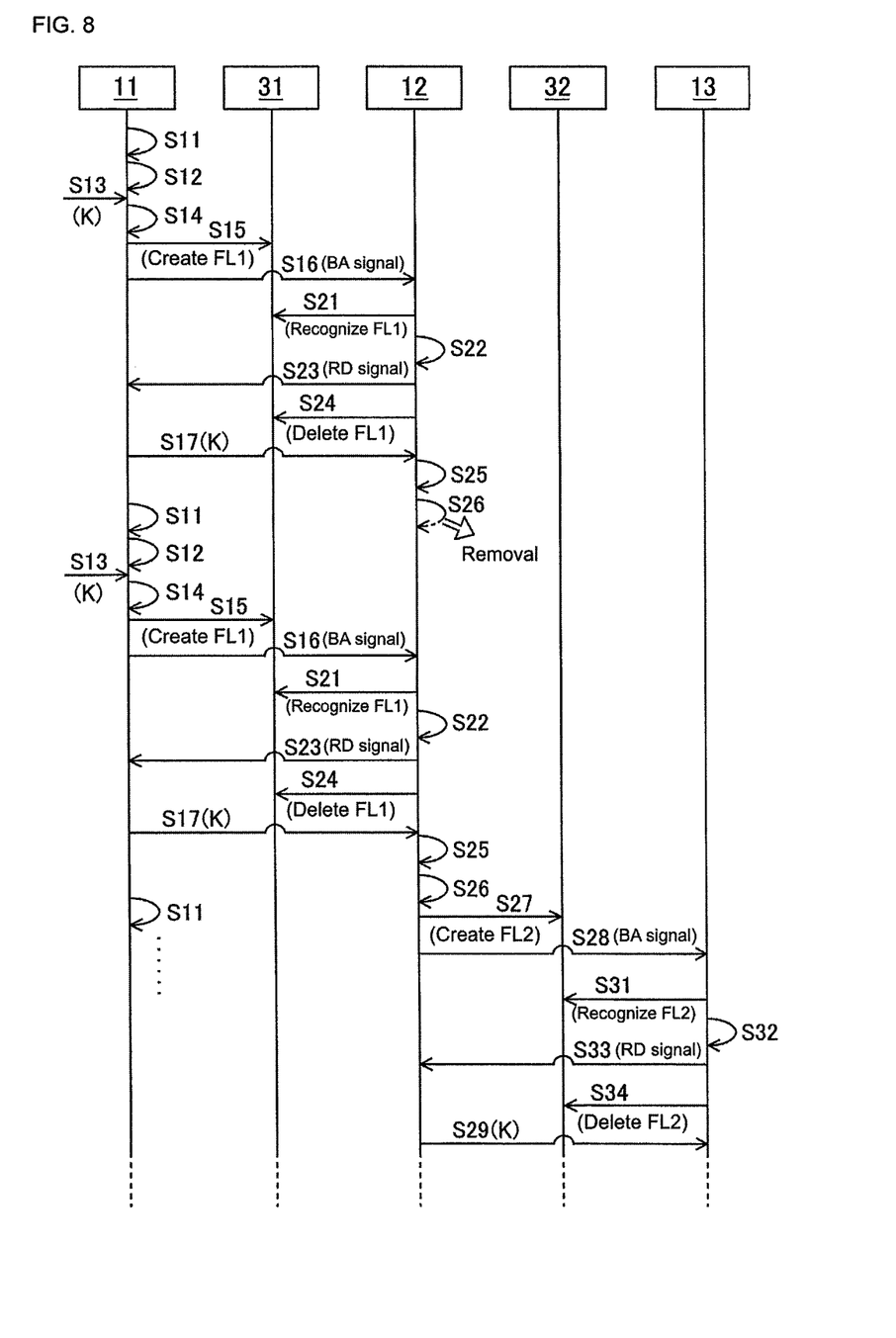
FIG. 8 illustrates operation in a case in which a substrate is removed from the middle of the substrate production line.

FIG. 8 illustrates operation in a case in which a substrate K is removed from the middle of substrate production line 1. In the example shown in FIG. 8, in S26, when printing inspection machine 12 is inspecting the state of the solder printed on substrate K, a defect has been detected and the substrate K removed. In this case, printing inspection machine 12 waits for the next signal BA without performing operations from S26. Then, upon solder printer 11 sending the next signal BA, printing inspection machine 12 performs operation of S21. As such, if substrate K is removed, the substrate type information file is not created. Accordingly, the relationship between the substrate K conveyed downstream and the substrate type information file created in shared folder 3 is maintained reliably.

Described next is operation in a case in which terminate flag Tm of the substrate type information file is set to on. When terminate flag Tm is on, the substrate production machine knows that the substrate K being produced currently is the final one of the substrate type. The substrate production machine performs production work on the final substrate K, creates the corresponding substrate type information file, then stops operation after unloading the final substrate K. Upon doing this, at the point at which production of the final substrate K is complete, all of the substrate production machines are in a stopped state. Thus, at this point, it is possible to perform relatively large scale changeover work.

It is not necessary for all the substrate production machines to be in a stopped state due to the terminate flag Tm. That is, regardless of the terminate flag Tm, a substrate production machine can be set to continue operation. In this case, when switching between substrate types for which changeover work by an operator is not required, the substrate production machine can automatically start production of the next substrate type.

Also, in a case of producing a multi-board substrate KL, the substrate production machine omits production work for individual substrates KS that cannot be used based on skip information Skp of the substrate type information file.

5. Forms and Effects of Substrate Production Line 1 of the First Embodiment

Substrate production line 1 of the first embodiment is provided with: five substrate production machines (solder printer 11, printing inspection machine 12, first electronic component mounter 13, second electronic component mounter 14, and substrate appearance inspection machine 15) arranged in a line from upstream to downstream and configured to each load a substrate K from an upstream side, perform production work on the substrate K in accordance with a type of the substrate K, and unload the substrate K to a downstream side; shared folder 3 in which an electronic file from each of the substrate production machines can be created and recognized; substrate type grasping section 4 provided on the substrate production machine furthest upstream in the line (solder printer 11) and configured to grasp the type of the substrate K before the substrate K is loaded; a file creating section (81, 83) provided on the substrate production machine other than the substrate production machine furthest downstream in the line (11, 12, 13, 14) and configured to create in the shared folder 3 a substrate type information file (FL1, FL2, FL3) including substrate type information IK indicating the type of the substrate K in accordance with unloading of the substrate K; and a file recognizing section (93, 95) provided on the substrate production machine other than the substrate production machine furthest upstream in the line (12, 13, 14, 15) and configured to recognize the substrate type information file (FL1, FL2, FL3) created by the substrate production machine directly adjacent at the upstream side before the substrate K is loaded.

Accordingly, the file creating section (81, 83) provided on an upstream substrate production machine creates the substrate type information file (FL1, FL2, FL3) in shared folder 3, and the file recognizing section (93, 95) provided on a downstream substrate production machine recognizes the substrate type information file (FL1, FL2, FL3). Thus, substrate type information IK is sent in order to the downstream substrate production machines in accordance with conveyance of the substrate K. Accordingly, each substrate production machine (11, 12, 13, 14, 15) that configures substrate production line 1 does not require a communication function for communicating with the other machines, and the type of the substrate K can be easily grasped using shared folder 3.

Also, the substrate production machines other than the furthest upstream machine (12, 13, 14, 15) do not have to be provided with a substrate type grasping section 4. Accordingly, costs can be reduced by the amount required for a substrate type grasping section 4 and space for the substrate type grasping section 4 is not required.

Further, substrate production line 1 of the first embodiment is further provided with a file deleting section (94, 96) provided on substrate production machines other than the furthest upstream machine (12, 13, 14, 15) and configured to delete the substrate type information file (FL1, FL2, FL3) recognized by the file recognizing section (93, 95) from shared folder 3. Accordingly, because old and new substrate type information files (FL1, FL2, FL3) do not get mixed, file errors are prevented reliably. Also, shared folder 3 does not become full of substrate type information files (FL1, FL2, FL3).

Further, substrate production line 1 of the first embodiment is also provided with a changeover performing section (7A, 7B, 7C) on at least a portion of the substrate production machines and configured to perform a changeover operation in accordance with a change in the type of the substrate K. Accordingly, changeover operations are performed automatically based on the grasped substrate K type.

Also, the substrate type information files (FL1, FL2, FL3) include an identification information ID that individually identifies substrates K. Accordingly, in addition to substrate type information IK, the identification information ID is sent in order to the downstream substrate production machines in accordance with conveyance of the substrate K.

Further, the substrate type information files (FL1, FL2, FL3) include terminate flag Tm indicating that the quantity of produced substrates K has reached the planned production quantity for substrate K. Accordingly, because the terminate flag Tm is sent in order to the downstream substrate production machines, each substrate production machine is able to determine that the substrate K currently being produced is the final substrate K of that substrate K type.

Further, in a case in which substrate K is a multi-board substrate KL consisting of multiple individual substrates KS, the substrate type information file (FL1, FL2, FL3) includes skip information Skp indicating individual substrates KS that cannot be used. Accordingly, because skip information Skp is sent in order to the downstream substrate production machines, each substrate production machine does not perform unnecessary production work on individual substrates KS that cannot be used.

Also, a substrate production machine (first electronic component mounter 13) of the present embodiment includes: a work performing section (mounting performing section 6C) configured to load a substrate K from an upstream side, perform production work (mounting work) in accordance with a type of the substrate K, and unload the substrate to a downstream side; shared folder 3 in which a file can be created and recognized, and in which the file can be created and recognized from an upstream side substrate production machine (printing inspection machine 12) and a downstream side substrate production machine (second electronic component mounter 14); file recognizing section 93 configured to recognize substrate type information file FL2 including substrate type information IK indicating a type of the substrate K, the substrate type information file FL being created in the shared folder 3 by the upstream substrate production machine (printing inspection machine 12) in accordance with loading of the substrate K; and file creating section 83 configured to create in the shared folder 3 substrate type information file FL3 to be recognized by the downstream side substrate production machine (second electronic component mounter 14) in accordance with unloading of the substrate K, the substrate type information file FL3 including the substrate type information IK.

Accordingly, a substrate production machine (first electronic component mounter 13) includes shared folder 3 shared between an upstream side substrate production machine (printing inspection machine 12) and a downstream side substrate production machine (second electronic component mounter 14), and recognizes substrate type information file FL2 created by the upstream substrate production machine (printing inspection machine 12) in accordance with loading of the substrate K, and creates in the shared folder 3 substrate type information file FL3 in accordance with unloading of the substrate K. Accordingly, the substrate production machine (first electronic component mounter 13) does not require a communication function and is able to easily grasp the type of the substrate K by receiving substrate type information IK from an upstream side using shared folder 3. Further, the substrate production machine (first electronic component mounter 13) is able to easily send the substrate type information to a downstream side.

6. Substrate Production Line 10 of a Second Embodiment

Figure 9:
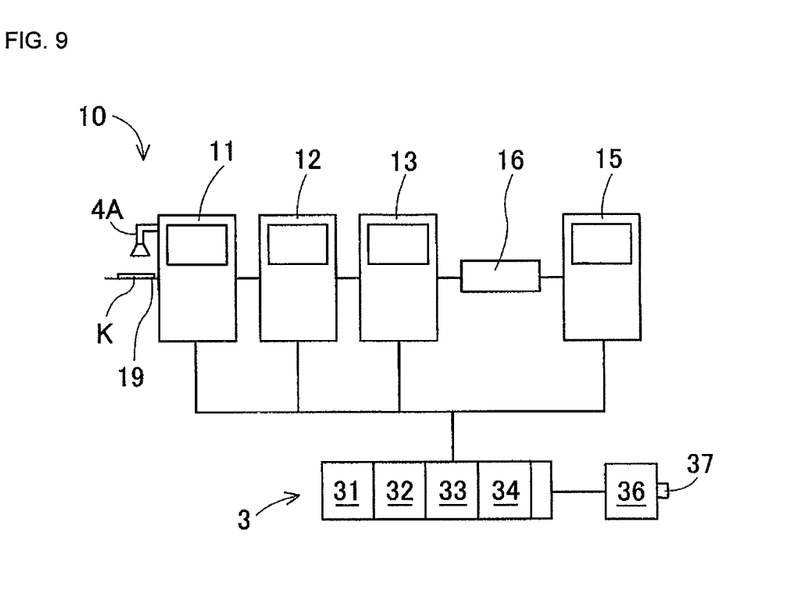
FIG. 9 schematically shows the configuration of substrate production line 10 of a second embodiment.

Next, main differences to the first embodiment of substrate production line 10 of a second embodiment are described. FIG. 9 schematically shows the configuration of substrate production line 10 of a second embodiment. Substrate production line 10 of the second embodiment has non-shared substrate production machine 16 in place of second electronic component mounter 14 of substrate production line 1 of the first embodiment. Non-shared substrate production machine 16 cannot create an electronic file in shared folder 3 and cannot recognize a file in shared folder 3. Examples of a non-shared substrate production machine 16 are a substrate conveyance device that only conveys substrate K, a buffer device at which substrate K is temporarily held, a substrate flipping device that flips substrate K, and so on.

Substrate production line 10 of the second embodiment is provided with file transfer enabling section 36. File transfer enabling section 36 accesses a file in shared folder 3 instead of non-shared substrate production machine 16. File transfer enabling section 36 acquires substrate type information file FL3 from third area 33 of shared folder 3 in accordance with loading of substrate K by non-shared substrate production machine 16. This substrate type information file is created by first electronic component mounter 13 that is immediately upstream of non-shared substrate production machine 16. File transfer enabling section 36, after acquiring the substrate type information file FL3, deletes the remaining substrate type information file FL3 from third area 33.

File transfer enabling section 36 waits for the substrate type information file to be deleted from fourth area 34 of shared folder 3. The file to be deleted corresponds to a previous substrate K, and is deleted by substrate appearance inspection machine 15 that is immediately downstream of non-shared substrate production machine 16. After deletion, file transfer enabling section 36 creates a copy of the acquired substrate type information file FL3 with just the filename changed in fourth area 34. This prevents files from being overwritten. The copied file in fourth area 34 is recognized by substrate appearance inspection machine 15, that is, is transferred to substrate appearance inspection machine 15.

Further, an operator, when removing a substrate K from non-shared substrate production machine 16, pushes removal button 37 of file transfer enabling section 36. Here, file transfer enabling section 36 discards the acquired substrate type information file FL3 and does not create the copied file in fourth area 34. Thus, substrate production line 10 containing non-shared substrate production machine 16 reliably maintains a corresponding relationship between conveyed substrates K and substrate type information files.

Note that, file transfer enabling section 36 may be provided with a code reader instead of removal button 37. The code reader may read code information of removed substrate K and send the code information to file transfer enabling section 36. Thus, file transfer enabling section 36 can reliably discard the substrate type information file corresponding to the received code information.

With substrate production line 10 of the second embodiment, included in the multiple substrate production machines is non-shared production machine 16 that is unable to create the electronic files in shared folder 3, or unable to recognize the files of shared folder 3, and further provided is file transfer enabling section 36 configured to, in accordance with the substrate K being loaded and unloaded by non-shared substrate production machine 16, acquire from the shared folder 3 the substrate type information file FL3 created by the substrate production machine directly upstream from the non-shared substrate production machine 16 (first electronic component mounter 13) and transfer the substrate type information file FL3 to the substrate production machine directly downstream of the non-shared substrate production machine 16 (substrate appearance inspection machine 15).

Thus, even when non-shared substrate production machine 16 is included in substrate production line 10, due to file transfer enabling section 36 being provided, substrate type information IK is sent in order to the downstream substrate production machines in accordance with conveyance of the substrate K. Accordingly, each substrate production machine (11, 12, 13, 15) does not require a communication function for communicating with the other machines, and the type of the substrate K can be easily grasped using shared folder 3.

7. Applications and Alternative Embodiments

Note that, in the first and second embodiments, only substrate type information IK of the substrate type information file (FL1, FL2, FL3) is essential, other information such as the identification information ID is not essential. Also, preventing errors with substrate type information files (FL1, FL2, FL3) may be performed using only one of dividing shared folder 3 and having different filenames Nm. Various other applications and modifications are possible for the present disclosure.

REFERENCE SIGNS LIST

1: substrate production line;
10: substrate production line;
11: solder printer;
12: printing inspection machine;
13: first electronic component mounter;
14: second electronic component mounter;
15: substrate appearance inspection machine;
3: shared folder;
31: first area;
32: second area;
33: third area;
34: fourth area;
36: file transfer enabling section;
4: substrate grasping section;
41: camera control section;
4A: substrate reading camera;
63: mounting control section;
6c: mounting performing section;
71: changeover control section;
73: changeover control section;
75: changeover control section;
7A: changeover performing section;
7B: changeover instruction section;
7C: changeover performing section;
7D: changeover instruction section;
7E: changeover performing section;
7F: changeover instruction section;
81: file creating section;
83: file creating section;
93: file recognizing section;
94: file deleting section;
95: file recognizing section;
96: file deleting section;
K: substrate;
KL: multi-board substrate;
KS: single board;
FL1: substrate type information file;
FL2: substrate type information file;
FL3: substrate type information file;
Nm: filename;
IK: substrate type information;
ID: recognition information;

Tm: terminate flag;
Skp: skip information

The invention claimed is:

1. A substrate production line comprising:
substrate production machines arranged in a line from upstream to downstream and configured to each load a substrate from an upstream side, perform production work on the substrate in accordance with a type of the substrate, and unload the substrate to a downstream side, each of the substrate production machines including a controller;
a memory which is external from the substrate production machines and includes a shared folder in which an electronic file from each of the substrate production machines can be created and recognized; and
a substrate type grasping section provided on the substrate production machine furthest upstream in the line and configured to grasp the type of the substrate before the substrate is loaded, the substrate type grasping section including a substrate type reading camera,
wherein the controller of each substrate production machine other than the substrate production machine furthest downstream in the line includes a file creating section configured to create in the shared folder a substrate type information file including substrate type information indicating the type of the substrate in accordance with unloading of the substrate,
wherein the controller of each substrate production machine other than the substrate production machine furthest upstream in the line includes a file recognizing section configured to recognize the substrate type information file created by the substrate production machine directly adjacent at the upstream side before the substrate is loaded, and
wherein the controller of each substrate production machine other than the substrate production machine furthest upstream in the line includes a file deleting section configured to delete the substrate type information file created by the substrate production machine directly adjacent at the upstream side before the substrate is loaded and recognized by the file recognizing section from the shared folder.

2. The substrate production line according to claim 1, wherein at least one controller of the substrate production machines includes a changeover performing control section configured to control a changeover operation in accordance with a change in the type of the substrate.

3. The substrate production line according to claim 1, wherein
the substrate type information file includes identification information used to individually identify the substrate.

4. The substrate production line according to claim 1, wherein
the substrate type information file includes a terminate flag indicating that a production completed quantity of the substrate has reached a production plan quantity of the substrate.

5. The substrate production line according to claim 1, wherein
the substrate is a multi-board substrate made of multiple individual boards and the substrate type information file includes skip information indicating individual substrates that cannot be used.

6. The substrate production line according to claim 1, wherein
included in the substrate production machines is a non-shared substrate production machine that is unable to create the electronic files in the shared folder, or unable to recognize the files of the shared folder, and
further provided is
a file transfer enabling section including circuitry configured to, in accordance with the substrate being loaded and unloaded by the non-shared substrate production machine, acquire from the shared folder the substrate type information file created by the substrate production machine directly upstream from the non-shared substrate production machine and transfer the substrate type information file to the substrate production machine directly downstream of the non-shared substrate production machine.

* * * * *